(12) United States Patent
Kikuchi et al.

(10) Patent No.: US 11,387,807 B2
(45) Date of Patent: Jul. 12, 2022

(54) ELASTIC WAVE DEVICE, HIGH-FREQUENCY FRONT END CIRCUIT, AND COMMUNICATION DEVICE

(71) Applicant: Murata Manufacturing Co., Ltd., Nagaokakyo (JP)

(72) Inventors: Taku Kikuchi, Nagaokakyo (JP); Akira Michigami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 821 days.

(21) Appl. No.: 16/274,290

(22) Filed: Feb. 13, 2019

(65) Prior Publication Data

US 2019/0181829 A1 Jun. 13, 2019

Related U.S. Application Data

(63) Continuation of application No. PCT/JP2017/026889, filed on Jul. 25, 2017.

(30) Foreign Application Priority Data

Sep. 27, 2016 (JP) .............................. JP2016-187788

(51) Int. Cl.
*H03H 9/02* (2006.01)
*H01L 41/047* (2006.01)
(Continued)

(52) U.S. Cl.
CPC ....... *H03H 9/14541* (2013.01); *H01L 41/047* (2013.01); *H03H 3/08* (2013.01);
(Continued)

(58) Field of Classification Search
CPC .. H03H 9/14541; H03H 6/02992; H03H 9/25; H03H 9/725; H03H 9/02897; H03H 9/02622; H01L 41/047
(Continued)

(56) References Cited

U.S. PATENT DOCUMENTS

2012/0200371 A1 8/2012 Yamashita
2012/0223789 A1 9/2012 Inoue et al.
(Continued)

FOREIGN PATENT DOCUMENTS

JP 07-78817 A 3/1995
JP 2005-260909 A 9/2005
(Continued)

OTHER PUBLICATIONS

Official Communication issued in International Patent Application No. PCT/JP2017/026889, dated Oct. 24, 2017.

*Primary Examiner* — Derek J Rosenau (74) *Attorney, Agent, or Firm* — Keating & Bennett, LLP (57) ABSTRACT

An elastic wave device includes first and second IDT electrodes provided over a principal surface of a piezoelectric substrate. The first IDT electrode is provided directly on a principal surface of the piezoelectric substrate and the second IDT electrode is provided over the principal surface with a first dielectric layer interposed therebetween. A second dielectric layer extends to upper portions of the first and second IDT electrodes. A wiring electrode passes over the second dielectric layer and extends to the upper portions of the first and second IDT electrodes. Respective angles between first and second side surfaces of the second dielectric layer and the principal surface of the piezoelectric substrate are smaller than an angle between a side surface of the first dielectric layer and the principal surface of the piezoelectric substrate.

20 Claims, 3 Drawing Sheets

(51) Int. Cl.
  *H03H 9/145* (2006.01)
  *H03H 9/72* (2006.01)
  *H03H 3/08* (2006.01)
  *H03H 9/25* (2006.01)
(52) U.S. Cl.
  CPC .... *H03H 9/02622* (2013.01); *H03H 9/02897* (2013.01); *H03H 9/02992* (2013.01); *H03H 9/725* (2013.01); *H03H 9/25* (2013.01)
(58) Field of Classification Search
  USPC ...... 310/313 R, 313 A, 313 B, 313 C, 313 D
  See application file for complete search history.

(56) References Cited

U.S. PATENT DOCUMENTS

| | | |
|---|---|---|
| 2015/0207050 A1 | 7/2015 | Tsukada et al. |
| 2016/0277003 A1 | 9/2016 | Kikuchi et al. |
| 2017/0155372 A1 | 6/2017 | Kikuchi et al. |

FOREIGN PATENT DOCUMENTS

| | | |
|---|---|---|
| JP | 2007-208665 A | 8/2007 |
| JP | 4036856 B2 | 1/2008 |
| JP | 2008-118576 A | 5/2008 |
| JP | 2010-114221 A | 5/2010 |
| JP | 2012-169707 A | 9/2012 |
| JP | 2012-182604 A | 9/2012 |
| JP | 2013-021387 A | 1/2013 |
| WO | 2013/168223 A1 | 11/2013 |
| WO | 2015/098678 A1 | 7/2015 |
| WO | 2016063738 A1 | 4/2016 |

ELASTIC WAVE DEVICE, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2016-187788 filed on Sep. 27, 2016 and is a Continuation Application of PCT Application No. PCT/JP2017/026889 filed on Jul. 25, 2017. The entire contents of each of these applications are hereby incorporated herein by reference.

BACKGROUND OF THE INVENTION

1. Field of the Invention

The present invention relates to an elastic wave device, a high-frequency front end circuit, and a communication device, including a first interdigital transducer (IDT) electrode and a second IDT electrode provided over a piezoelectric substrate.

2. Description of the Related Art

Japanese Patent No. 4036856 discloses a band pass filter, in which a plurality of surface acoustic wave elements are arranged over a piezoelectric substrate. An insulative material layer is provided between an IDT electrode of one of the surface acoustic wave element and the piezoelectric substrate. In another one of the surface acoustic wave elements, an IDT electrode is provided directly on the piezoelectric substrate. The one surface acoustic wave element and the other surface acoustic wave element are electrically coupled by a coupling electrode.

When a wiring electrode as a coupling electrode electrically couples one IDT electrode and another IDT electrode, the wiring electrode extends to an upper portion of the other IDT electrode from an upper portion of the one IDT electrode. To decrease electrical resistance, an electrode layer as a second layer may be provided over the wiring electrode.

In the band pass filter described in Japanese Patent No. 4036856, however, the upper surface of the one IDT electrode has a different height from the upper surface of the other IDT electrode. Accordingly, the difference in height causes an elevation portion. Thus, a break may occur in a wiring electrode or an electrode layer over the wiring electrode.

SUMMARY OF THE INVENTION

Preferred embodiments of the present invention provide elastic wave devices, high-frequency front end circuits, and communication devices in each of which a break in a wiring electrode is unlikely to occur.

An elastic wave device according to a preferred embodiment of the present invention includes a piezoelectric substrate that includes a principal surface; a first interdigital transducer (IDT) electrode that is provided over the principal surface of the piezoelectric substrate; a first dielectric layer that is provided over the principal surface of the piezoelectric substrate; a second IDT electrode that is provided over the first dielectric layer; a second dielectric layer that extends to an upper portion of the second IDT electrode from an upper portion of the first IDT electrode and that, in a direction connecting the first IDT electrode and the second IDT electrode, includes a first side surface linked to the first IDT electrode, a second side surface linked to the second IDT electrode, and an upper surface connecting the first side surface and the second side surface; and a wiring electrode that passes over the second dielectric layer and extends to an upper portion of the second IDT electrode from an upper portion of the first IDT electrode, where in a cross section along the direction connecting the first IDT electrode and the second IDT electrode, respective angles between the first side surface and the second side surface of the second dielectric layer and the principal surface of the piezoelectric substrate are smaller than an angle between a side surface of the first dielectric layer positioned in an end portion toward the first IDT electrode and the principal surface of the piezoelectric substrate.

In an elastic wave device according to a preferred embodiment of the present invention, an elevation portion is provided on the upper surface of the second dielectric layer above the end portion of the first dielectric layer toward the first IDT electrode.

In an elastic wave device according to a preferred embodiment of the present invention, an angle between an inclined surface defining the elevation portion on the upper surface of the second dielectric layer and the principal surface of the piezoelectric substrate is smaller than an angle between the side surface of the first dielectric layer positioned in the end portion toward the first IDT electrode and the principal surface of the piezoelectric substrate.

In an elastic wave device according to a preferred embodiment of the present invention, in the cross section along the direction connecting the first IDT electrode and the second IDT electrode, an elevation portion is provided on the principal surface of the piezoelectric substrate, a height of the principal surface on a side of the piezoelectric substrate on which the first IDT electrode is provided is different from a height of the principal surface on a side of the piezoelectric substrate on which the second IDT electrode is provided, and a size of the elevation portion on the upper surface of the second dielectric layer is smaller than a total of a size of the elevation portion on the piezoelectric substrate and a thickness of the first dielectric layer. In this case, a break in a wiring electrode is less likely to occur.

In an elastic wave device according to a preferred embodiment of the present invention, the wiring electrode passes over the elevation portion on the upper surface of the second dielectric layer. Also in this case, a break in a wiring electrode is unlikely to occur.

In an elastic wave device according to a preferred embodiment of the present invention, the upper surface of the second dielectric layer is a flat surface. In this case, a break in a wiring electrode is less likely to occur over the upper surface of the second dielectric layer.

In an elastic wave device according to a preferred embodiment of the present invention, the first IDT electrode and the second IDT electrode are separated with the elevation portion of the piezoelectric substrate interposed therebetween.

In an elastic wave device according to a preferred embodiment of the present invention, the second dielectric layer is provided over the first IDT electrode and the second IDT electrode.

In an elastic wave device according to a preferred embodiment of the present invention, in the cross section along the direction connecting the first IDT electrode and the second IDT electrode, the elevation portion is provided on the principal surface of the piezoelectric substrate, the height of the principal surface on the side of the piezoelectric substrate on which the first IDT electrode is provided is different from the height of the principal surface on the side of the piezoelectric substrate on which the second IDT electrode is provided. In this case, a dielectric layer is provided over the first IDT electrode and the second IDT electrode. Therefore, when, for example, the dielectric layer is polished by a chemical mechanical polishing (CMP) method, the thickness of the dielectric layer provided over the first IDT electrode and the thickness of the dielectric layer provided over the second IDT electrode are able to be adjusted by providing a difference in height between the piezoelectric substrate below the first IDT electrode and the piezoelectric substrate below the second IDT electrode. Accordingly, the frequency band width and temperature characteristics are able to be adjusted for each IDT electrode.

In an elastic wave device according to a preferred embodiment of the present invention, the elevation portion of the piezoelectric substrate includes an end surface from which an angle is provided to the principal surface, and the angle provided by the end surface and the principal surface is smaller than the angle between the side surface of the first dielectric layer positioned in the end portion toward the first IDT electrode and the principal surface of the piezoelectric substrate.

A high-frequency front end circuit according to a preferred embodiment of the present invention includes an elastic wave device according to a preferred embodiment of the present invention and a power amplifier.

A communication device according to a preferred embodiment of the present invention includes a high-frequency front end circuit according to a preferred embodiment of the present invention; and an RF signal processing circuit.

Preferred embodiments of the present invention provide elastic wave devices, high-frequency front end circuits, and communication devices, in each of which a break in a wiring electrode is unlikely to occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to accompanying drawings.

The preferred embodiments described herein are examples and it should be noted that partial replacements or combinations of elements are possible between different ones of the preferred embodiments.

Figure 2:
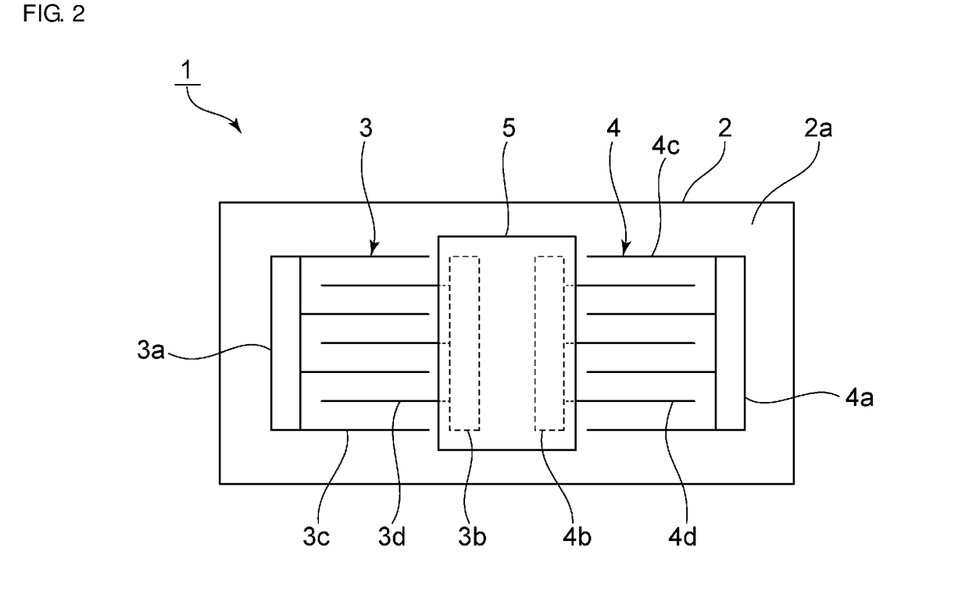
FIG. 2 is a schematic plan view illustrating an electrode configuration of the elastic wave device according to the first preferred embodiment of the present invention.

FIG. 2 is a schematic plan view illustrating an electrode configuration of an elastic wave device 1 according to a first preferred embodiment of the present invention. A first dielectric layer and a second dielectric layer, which will be described later, are not illustrated in FIG. 2.

The elastic wave device 1 includes a piezoelectric substrate 2. The piezoelectric substrate 2 is preferably made of, for example, a piezoelectric single crystal, such as $LiTaO_3$ or $LiNbO_3$. The piezoelectric substrate 2 may be made of piezoelectric ceramics.

The piezoelectric substrate 2 includes a principal surface 2a. A first IDT electrode 3 and a second IDT electrode 4 are provided over the principal surface 2a. The first IDT electrode 3 preferably defines a single elastic wave resonator. The second IDT electrode 4 preferably defines another single elastic wave resonator. Although not illustrated in FIG. 2, reflectors are provided on both sides in the elastic wave propagation direction of the first IDT electrode 3 and the second IDT electrode 4. Accordingly, a one-port elastic wave resonator is provided.

The first IDT electrode 3 includes a first busbar 3a and a second busbar 3b, which are opposed to each other. One end of each of a plurality of first electrode fingers 3c is coupled to the first busbar 3a. One end of each of a plurality of second electrode fingers 3d is coupled to the second busbar 3b. The plurality of first electrode fingers 3c and the plurality of second electrode fingers 3d are interdigitated.

The second IDT electrode 4 has a configuration similar to that of the first IDT electrode 3. That is, the second IDT electrode 4 includes a first busbar 4a and a second busbar 4b. Further, a plurality of first electrode fingers 4c and a plurality of second electrode fingers 4d are provided.

The first IDT electrode 3 and the second IDT electrode 4 are each preferably made of a suitable metal, such as Ag, Pt, Mo, W, or Cu, for example, or an alloy including such a metal.

Over the principal surface 2a of the piezoelectric substrate 2, the wiring electrode 5 electrically couples the first IDT electrode 3 and the second IDT electrode 4. The wiring electrode 5 extends to an upper portion of the second IDT electrode from an upper portion of the first IDT electrode 3. More specifically, the wiring electrode 5 extends to an upper portion of the second busbar 4b of the second IDT electrode 4 from an upper portion of the first busbar 3b of the first IDT electrode 3 to.

Figure 1:
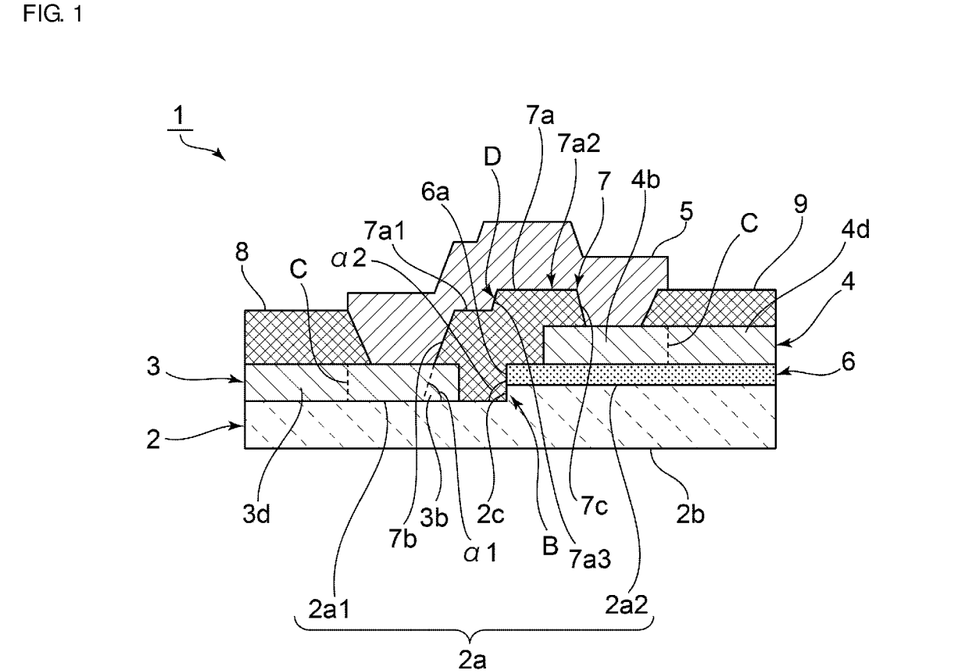
FIG. 1 is a partially enlarged front cross-sectional view illustrating a portion of an elastic wave device according to a first preferred embodiment of the present invention, in which a wiring electrode electrically couples a first IDT electrode and a second IDT electrode.

FIG. 1 is a partially enlarged front cross-sectional view illustrating a portion of the elastic wave device 1, in which a wiring electrode 5 electrically couples the first IDT electrode 3 and the second IDT electrode 4. FIG. 1 also illustrates the first dielectric layer and the second dielectric layer described below.

As illustrated in FIG. 1, the piezoelectric substrate 2 includes a principal surface 2a and a principal surface 2b, which is opposed to the principal surface 2a. An elevation portion B is provided on the principal surface 2a. That is, a principal surface portion 2a1 on one side of the elevation portion B and a principal surface portion 2a2 on the other side are at different heights. In the present preferred embodiment, the principal surface portion 2a2 is higher than the principal surface portion 2a1.

The first IDT electrode 3 is provided on the principal surface portion 2a1. In the first IDT electrode 3, a broken line C indicates a boundary portion between the second busbar 3b and the second electrode fingers 3d. A first dielectric layer 6 is provided on the principal surface portion 2a2. For the first dielectric layer 6, a suitable dielectric material, such as $SiO_2$ or SiN, for example, may be used. Preferably, SiO, SiON, or other suitable material, for example, is used because of its capability of decreasing the absolute value of TCF.

The second IDT electrode 4 is provided on the first dielectric layer 6. Also in the second IDT electrode 4, the second busbar 4b is on one side of a portion indicated by a broken line C and the second electrode fingers 4d are on the other side.

A side surface 6a of the first dielectric layer 6, which is positioned in an end portion toward the first IDT electrode 3, is positioned over the elevation portion B. The first dielectric layer 6 is provided so that an end surface 2c of the piezoelectric substrate 2, which defines the elevation portion B, and the side surface 6a are flush with each other. It is not necessarily required for the side surface 6a and the end surface 2c to be flush with each other.

Further, in the present preferred embodiment, an angle α2 between the side surface 6a and the principal surface 2a of the piezoelectric substrate 2 is preferably approximately 90°, for example. In the present preferred embodiment, the first IDT electrode 3 is separated from the elevation portion B in the direction connecting the first IDT electrode 3 and the second IDT electrode 4. The second IDT electrode 4 is also separated from the elevation portion B in the direction connecting the first IDT electrode 3 and the second IDT electrode 4. Accordingly, the first IDT electrode 3 and the second IDT electrode 4 are separated from each other in the direction connecting the first IDT electrode 3 and the second IDT electrode 4. In a preferred embodiment of the present invention, the first IDT electrode 3 and the second IDT electrode 4 may be partially in contact with each other in the direction connecting the first IDT electrode 3 and the second IDT electrode 4.

A second dielectric layer 7 extends to an upper portion of the second busbar 4b of the second IDT electrode 4 from an upper portion of the second busbar 3b of the first IDT electrode 3 and fills a region between the first IDT electrode 3 and the second IDT electrode 4. In the present preferred embodiment, the second dielectric layer 7 is preferably made of a dielectric material the same or substantially the same as to the material of the first dielectric layer 6. Accordingly, the materials of the first dielectric layer 6 and the second dielectric layer 7 are the same or substantially the same. Thus, the number of materials to be used is reduced.

The material of the second dielectric layer 7 may be different from the material of the first dielectric layer 6.

In the direction connecting the first IDT electrode 3 and the second IDT electrode 4, the second dielectric layer 7 includes a first side surface 7b linked to the first IDT electrode 3, a second side surface 7c linked to the second IDT electrode 4, and an upper surface 7a connecting the first side surface 7b and the second side surface 7c. That is, the first side surface 7b is directly linked to the upper surface of the first IDT electrode 3. Similarly, the second side surface 7c is directly linked to the upper surface of the second IDT electrode 4.

An angle α1 between the first side surface 7b or the second side surface 7c and the principal surface 2a of the piezoelectric substrate 2 is preferably smaller than the angle α2 between the side surface 6a of the first dielectric layer 6 and the principal surface 2a of the piezoelectric substrate 2. Further, the angle α1 between the first side surface 7b or the second side surface 7c and the principal surface 2a of the piezoelectric substrate 2 is also preferably smaller than the angle α2 between the end surface 2c of the piezoelectric substrate 2 defining the elevation portion B and the principal surface 2a of the piezoelectric substrate 2. The angle α1 between the first side surface 7b and the principal surface 2a of the piezoelectric substrate 2 may be equal to or different from the angle α1 between the second side surface 7c and the principal surface 2a of the piezoelectric substrate 2.

The first side surface 7b and the second side surface 7c of the second dielectric layer 7 may include some unevenness instead of being flat surfaces. To define the respective angles between the first side surface 7b or the second side surface 7c and the principal surface 2a of the piezoelectric substrate 2 in cases including unevenness, the angles between straight lines that respectively connect the starting points and the ending points of the first side surface 7b and the second side surface 7c and the principal surface 2a of the piezoelectric substrate 2 are preferably used.

The second dielectric layer 7 is formed by, for example, a deposition method after forming the first IDT electrode 3 and the second IDT electrode 4. Accordingly, an elevation portion D is provided on the upper surface 7a of the second dielectric layer 7 because the elevation portion B and the first dielectric layer 6 are provided. That is, the elevation portion D is positioned above the elevation portion B and the side surface 6a.

In the upper surface 7a, an upper surface portion 7a2 disposed toward the second IDT electrode 4 is higher than an upper surface portion 7a1 disposed toward the first IDT electrode 3. Accordingly, the elevation portion D includes an inclined surface 7a3, which connects the upper surface portion 7a1 and the upper surface portion 7a2. The inclined surface 7a3 is inclined from a normal line relative to the principal surface 2a of the piezoelectric substrate 2. The angle of the inclined surface 7a3 relative to the principal surface 2a is preferably smaller than the angle between the end surface 2c and the side surface 6a to the principal surface 2a of the piezoelectric substrate 2.

Dielectric layers 8 and 9 preferably made of the same or substantially the same dielectric material as that for the second dielectric layer 7 are provided over the first IDT electrode 3 and the second IDT electrode 4. Further, the wiring electrode 5 extends to the upper portion of the second busbar 4b of the second IDT electrode 4 from the upper portion of the second busbar 3b of the first IDT electrode 3 and passes over the upper surface 7a of the second dielectric layer 7.

The wiring electrode 5 is preferably made of, for example, a suitable conductive material, such as Al, an AlCu alloy, or other suitable material. It is preferable to use a material with conductivity higher than those of the first IDT electrode 3 and the second IDT electrode 4. As a result, loss is able to be reduced.

In the elastic wave device 1, the upper surface of the second IDT electrode 4 is higher than the upper surface of the first IDT electrode 3. This is because the elevation portion B and the first dielectric layer 6 are provided. Typically, when a wiring electrode is defined by a film, a large elevation portion corresponding to the height difference is caused in the wiring electrode and a break is likely to occur.

In contrast, in the present preferred embodiment, the angle α1 between the first side surface 7b or the second side surface 7c of the second dielectric layer 7 and the principal surface 2a of the piezoelectric substrate 2 is smaller than the angle α2 between the end surface 2c and the side surface 6a and the principal surface 2a of the piezoelectric substrate 2. Thus, a break in the wiring electrode 5 is unlikely to occur. That is, even when, for example, a deposition method is used to form the wiring electrode 5 as a film, the inclinations of the first side surface 7b and the second side surface 7c are gentle. Thus, a break in the wiring electrode 5 is unlikely to occur.

Only the angle α1 between the first side surface 7b and the principal surface 2a of the piezoelectric substrate 2 may be smaller than the angle α2 between one of the end surface 2c and the side surface 6a and the principal surface 2a. That is, the angle α1 between the second side surface 7c and the principal surface 2a of the piezoelectric substrate 2 is not necessarily required to be smaller than the angle α2. On the contrary, only the angle α1 between the second side surface 7c and the principal surface 2a of the piezoelectric substrate 2 may be smaller than the angle α2. In that case, it is not required for the angle α1 between the first side surface 7b and the principal surface 2a of the piezoelectric substrate 2 to be smaller than the angle α2.

It is preferable, as in the present preferred embodiment, that the respective angles α1 between the first side surface 7b and the second side surface 7c and the principal surface 2a of the piezoelectric substrate 2 is smaller than the angle α2 between the end surface 2c and the side surface 6a and the principal surface 2a of the piezoelectric substrate 2. As a result, a break is less likely to occur.

Further, in the present preferred embodiment, a break in the wiring electrode 5 is also unlikely to occur over the elevation portion D. This is because the angle between the inclined surface 7a3 on the elevation portion D and the principal surface 2a of the piezoelectric substrate 2 is smaller than the angle α2 between the side surface 6a of the first dielectric layer 6 and the principal surface 2a of the piezoelectric substrate 2. In addition, the size of the elevation portion D, that is, the difference in height between the upper surface portion 7a1 and the upper surface portion 7a2 is preferably smaller than the difference in height between the upper surface of the first IDT electrode 3 and the upper surface of the second IDT electrode 4. This also makes a break in the wiring electrode 5 unlikely to occur. Accordingly, it is preferable for the size of the elevation portion D on the upper surface 7a of the second dielectric layer 7 to be smaller than the total of the size of the elevation portion B on the piezoelectric substrate 2 and the thickness of the first dielectric layer 6.

In manufacturing the elastic wave device 1, the piezoelectric substrate 2 without the elevation portion B is prepared. Subsequently, a dielectric film is formed on the piezoelectric substrate 2. After that, patterning is performed on the dielectric film by etching to form the first dielectric layer 6. During the etching, the elevation portion B is produced on the piezoelectric substrate 2 such that the principal surface portion 2a1 and the principal surface portion 2a2 have different heights on the principal surface 2a of the piezoelectric substrate 2.

Subsequently, the first IDT electrode 3 and the second IDT electrode 4 are formed. After that, a dielectric material is formed as a film and undergoes patterning. As a result, the second dielectric layer 7 is provided together with the dielectric layers 8 and 9. In the patterning, a through-hole through which the upper surfaces of the first IDT electrode 3 and the second IDT electrode 4 are exposed is provided in a portion of the film made from the dielectric material. After that, the wiring electrode 5 is formed to extend to the upper surface of the second IDT electrode 4 from the first IDT electrode 3.

The method for manufacturing the elastic wave device 1 is not limited to the above-described method.

Figure 3:
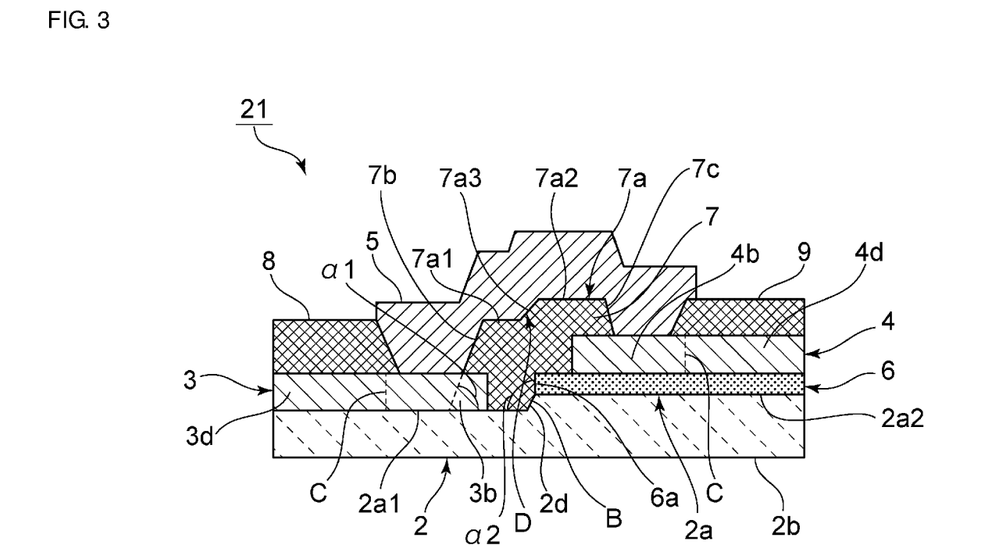
FIG. 3 is a partially enlarged front cross-sectional view illustrating a portion of an elastic wave device according to a second preferred embodiment of the present invention, in which a wiring electrode electrically couples a first IDT electrode and a second IDT electrode.

FIG. 3 is a partially enlarged front cross-sectional view of an elastic wave device according to a second preferred embodiment of the present invention along a cross section in the direction connecting a first IDT electrode and a second IDT electrode.

Also in the elastic wave device 21 according to the second preferred embodiment, an angle α1 between a first side surface 7b or a second side surface 7c and a principal surface 2a of a piezoelectric substrate 2 is preferably smaller than an angle α2 between a side surface 6a of a first dielectric layer 6 and the principal surface 2a of the piezoelectric substrate 2. Accordingly, a break in a wiring electrode 5 is unlikely to occur. Further, in the elastic wave device 21, an end surface 2d of the piezoelectric substrate 2 in an elevation portion B is inclined. That is, the angle between the end surface 2d and the principal surface 2a of the piezoelectric substrate 2 is preferably smaller than the angle α2 between the side surface 6a of the first dielectric layer 6 and the principal surface 2a of the piezoelectric substrate 2. Also in this case, the angle between an inclined surface 7a3 of a second dielectric layer 7 defining an elevation portion D and the principal surface 2a of the piezoelectric substrate 2 is preferably smaller than the angle between the side surface 6a and the principal surface 2a of the piezoelectric substrate 2. Accordingly, also in the elastic wave device 21 according to the second preferred embodiment, a break in the wiring electrode 5 is unlikely to occur over the elevation portion D. In addition, also in the present preferred embodiment, the size of the elevation portion D is smaller than the total of the size of the elevation portion B and the thickness of the first dielectric layer 6. This also makes a break in the wiring electrode 5 unlikely to occur.

As described above, a portion of the principal surface 2a of the piezoelectric substrate 2 defining the elevation portion B may be an inclined surface inclined from a normal line of the principal surface 2a of the piezoelectric substrate 2.

Figure 4:
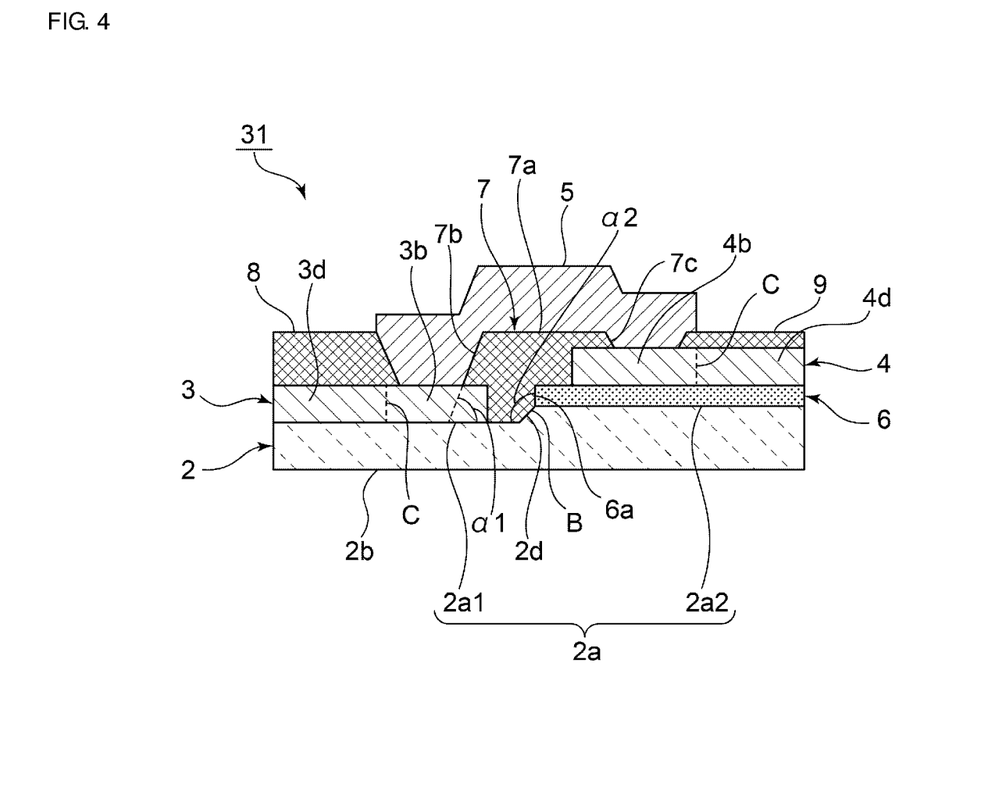
FIG. 4 is a partially enlarged front cross-sectional view illustrating a portion of an elastic wave device according to a third preferred embodiment of the present invention, in which a wiring electrode electrically couples a first IDT electrode and a second IDT electrode.

FIG. 4 is a partially enlarged front cross-sectional view illustrating a portion of an elastic wave device according to a third preferred embodiment of the present invention, in which a wiring electrode electrically couples a first IDT electrode and a second IDT electrode.

In the elastic wave device 31 according to the third preferred embodiment, an upper surface 7a of a second dielectric layer 7 is flat. Thus, the upper surface 7a of the second dielectric layer 7 may preferably be a flat surface. The upper surface 7a of the second dielectric layer 7 may be made flat by forming the second dielectric layer 7 and dielectric layers 8 and 9 as films and then, prior to or after patterning, polishing the upper surface of the second dielectric layer 7. The upper surfaces of the dielectric layers 8 and 9 are similarly polished.

Except that the upper surface 7a of the second dielectric layer 7 is a flat surface and that the upper surfaces of the dielectric layers 8 and 9 are polished, the elastic wave device 31 has a configuration the same as or similar to that of the elastic wave device 21.

Also in the elastic wave device 31, the respective angles between a first side surface 7b and a second side surface 7c and a principal surface 2a of a piezoelectric substrate 2 are preferably smaller than the angle between a side surface 6a of a first dielectric layer 6 and the principal surface 2a of the piezoelectric substrate 2. Accordingly, a break in a wiring electrode 5 is unlikely to occur.

Figure 5:
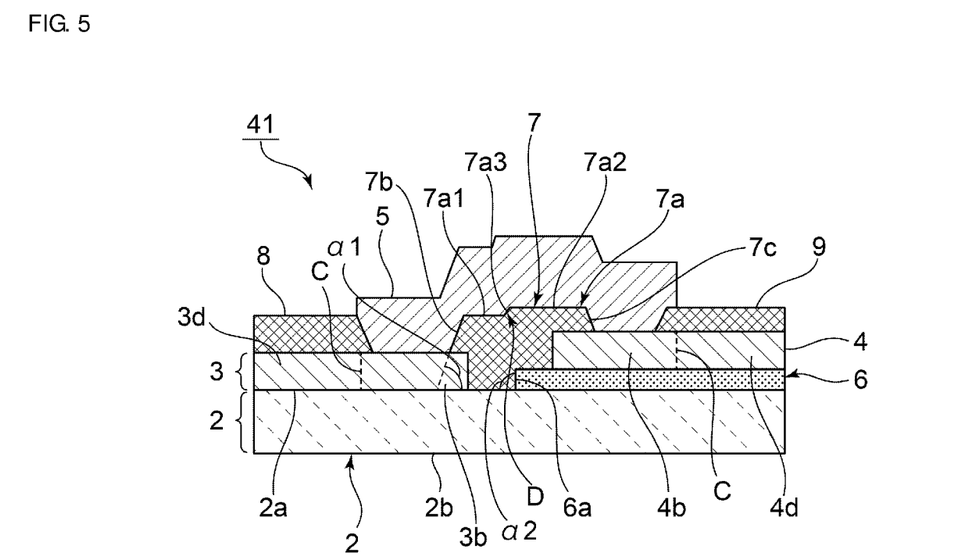
FIG. 5 is a partially enlarged front cross-sectional view illustrating a portion of an elastic wave device according to a fourth preferred embodiment of the present invention, in which a wiring electrode electrically couples a first IDT electrode and a second IDT electrode.

FIG. 5 is a partially enlarged front cross-sectional view illustrating a portion of an elastic wave device according to a fourth preferred embodiment of the present invention, in which a wiring electrode electrically couples a first IDT electrode and a second IDT electrode.

In the elastic wave device 41 according to the fourth preferred embodiment, a piezoelectric substrate 2 includes no elevation portion. Also in this case, the upper surface of the second IDT electrode 4 is higher than the upper surface of the first IDT electrode 3 because a first dielectric layer 6 is provided. Also in the present preferred embodiment, however, the respective angles between a first side surface 7b and a second side surface 7c and a principal surface 2a of a piezoelectric substrate 2 are preferably smaller than the angle between a side surface 6a of the first dielectric layer 6 and the principal surface 2a of the piezoelectric substrate 2. Accordingly, a break in a wiring electrode 5 is unlikely to occur. In addition, the inclination angle of an inclined surface 7a3 defining an elevation portion D is preferably smaller than the angle between the side surface 6a of the first dielectric layer 6 and the principal surface 2a of the piezoelectric substrate 2. Accordingly, a break in the wiring electrode 5 is also unlikely to occur over the side surface 6a.

Although the first IDT electrode 3 and the second IDT electrode 4 are provided over the dielectric layers 8 and 9 in the first to fourth preferred embodiments, the dielectric layers 8 and 9 may be omitted. It is preferable that the materials for the dielectric layers 8 and 9 are the same or substantially the same as that of the second dielectric layer 7. As a result, the manufacturing process is able to be simplified.

The second dielectric layer 7 and the dielectric layers 8 and 9 may be integrally provided and the second dielectric layer 7 may cover the first IDT electrode and the second IDT electrode. The materials of the dielectric layers 8 and 9 may be different from that of the second dielectric layer 7.

The elastic wave devices according to each of the above-described preferred embodiments may be used as a duplexer of a high-frequency front end circuit for example. This example is described below.

Figure 6:
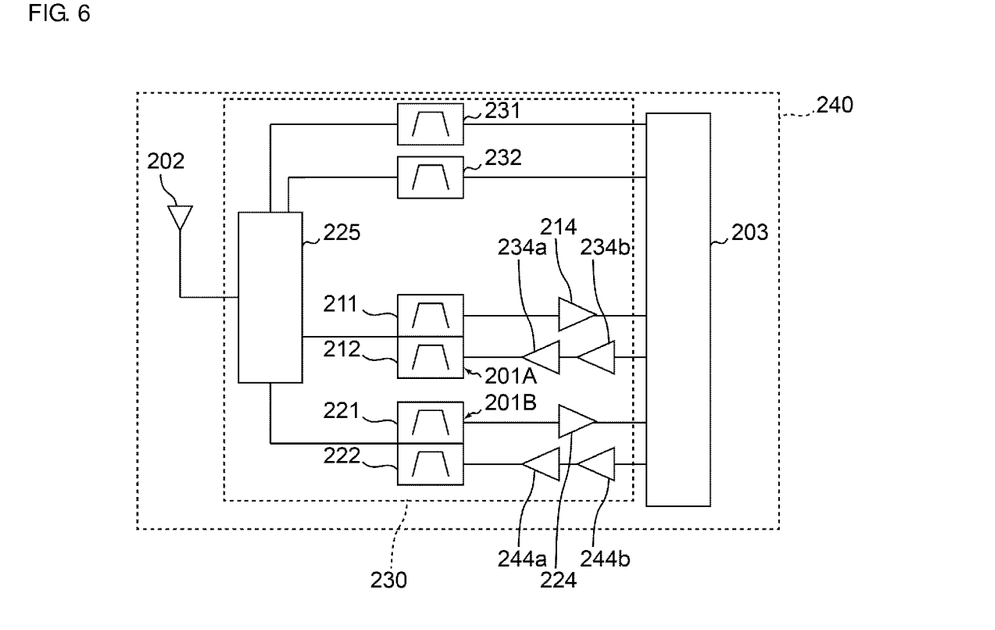
FIG. 6 is a configuration diagram illustrating a communication device and a high-frequency front end circuit according to a preferred embodiment of the present invention.

FIG. 6 is a configuration diagram illustrating a communication device and a high-frequency front end circuit according to a preferred embodiment of the present invention. FIG. 6 also illustrates elements coupled to the high-frequency front end circuit 230, such as an antenna element 202 and an RF signal processing circuit (RFIC) 203, for example. The high-frequency front end circuit 230 and the RF signal processing circuit 203 define the communication device 240. The communication device 240 may include a power supply, a CPU, and a display, for example.

The high-frequency front end circuit 230 includes a switch 225, duplexers 201A and 201B, filters 231 and 232, low-noise amplifier circuits 214 and 224, and power amplifier circuits 234a, 234b, 244a, and 244b. The high-frequency front end circuit 230 and the communication device 240 in FIG. 6 are examples of the high-frequency front end circuit and the communication device and are not limited to these configurations.

The duplexer 201A includes filters 211 and 212. The duplexer 201B includes filters 221 and 222. The duplexers 201A and 201B are coupled to the antenna element 202 with the switch 225 interposed therebetween. The elastic wave device may be used the duplexer 201A or 201B, or may be used for the filter 211, 212, 221, or 222.

Further, the elastic wave device may be applied to, for example, a multiplexer including three or more filters, such as a triplexer with three filters for which an antenna terminal is shared or a hexaplexer with six filters for which an antenna terminal is shared.

That is, examples of the elastic wave device include an elastic wave resonator, a filter, a duplexer, and a multiplexer with three or more filters. The multiplexer is not limited to the configuration in which both of a transmission filter and a reception filter are provided but may have a configuration in which only a transmission filter or only a reception filter is provided.

The switch 225 allows the antenna element 202 and a signal path corresponding to a predetermined band to be coupled in accordance with a control signal from a controller (not illustrated) and is preferably a single-pole double-throw (SPDT) switch, for example. The number of signal paths to which the antenna element 202 is coupled is not limited to one, and may be two or more. That is, the high-frequency front end circuit 230 may be suitable for carrier aggregation.

The low-noise amplifier circuit 214 is a reception amplification circuit that amplifies a high-frequency signal (herein, a high-frequency reception signal) that has passed through the antenna element 202, the switch 225, and the duplexer 201A and outputs the amplified signal to the RF signal processing circuit 203. The low-noise amplifier circuit 224 is a reception amplification circuit that amplifies a high-frequency signal (herein, a high-frequency reception signal) that has passed through the antenna element 202, the switch 225, and the duplexer 201B and outputs the amplified signal to the RF signal processing circuit 203.

The power amplifier circuits 234a and 234b are transmission amplification circuits that amplify a high-frequency signal (herein, a high-frequency transmission signal) that has been output from the RF signal processing circuit 203 and output the amplified signal to the antenna element 202 via the duplexer 201A and the switch 225. The power amplifier circuits 244a and 244b are transmission amplification circuits that amplify a high-frequency signal (herein, a high-frequency transmission signal) that has been output from the RF signal processing circuit 203 and output the amplified signal to the antenna element 202 via the duplexer 201B and the switch 225.

The RF signal processing circuit 203 performs signal processing on a high-frequency reception signal that has been input from the antenna element 202 through the reception signal path by down-conversion, for example, and outputs the reception signal generated through the signal processing. Further, the RF signal processing circuit 203 performs signal processing on an input transmission signal by up-conversion, for example, and outputs the high-frequency transmission signal generated through the signal processing to the power amplifier circuit 224. The RF signal processing circuit 203 is preferably, for example, an RFIC. The communication device may include a baseband (BB) IC. In this case, the BBIC performs signal processing on a reception signal processed in the RFIC. Further, the BBIC performs signal processing on a transmission signal and outputs the processed signal to the RFIC. A reception signal processed in the BBIC and a transmission signal before signal processing by the BBIC are, for example, image signals, audio signals, or other suitable signals.

The high-frequency front end circuit 230 may include a duplexer according to a variation of the duplexers 201A and 201B instead of the above-described duplexers 201A and 201B.

On the other hand, the filters 231 and 232 in the communication device 240 are coupled between the RF signal processing circuit 203 and the switch 225 without the low-noise amplifier circuits 214 and 224 or the power amplifier circuits 234a, 234b, 244a, and 244b interposed therebetween. Similar to the duplexers 201A and 201B, the filters 231 and 232 are also coupled to the antenna element 202 with the switch 225 interposed therebetween.

The high-frequency front end circuit 230 and the communication device 240 configured as described above enable the high-frequency front end circuit 230 and the communication device 240 to effectively confine elastic waves that are utilized while reducing unneeded waves by including an elastic wave resonator, a filter, a duplexer, a multiplexer with three or more filters, and other suitable devices, which each correspond to an elastic wave device according to a preferred embodiment of the present invention.

Although the elastic wave devices, the high-frequency front end circuits, and the communication devices according to preferred embodiments of the present invention are described above with reference to the preferred embodiments and variations thereof, the present invention also includes other preferred embodiments achieved by combining elements in the above-described preferred embodiments and variations, or variations obtained by adding various changes that a person skilled in the art are able to conceive to the above-described preferred embodiments within the scope not departing from the spirit of the present invention, and various devices in which the high-frequency front end circuits and the communication devices according to preferred embodiments of the present invention are installed.

Preferred embodiments of the present invention may be widely utilized for communication applications, such as cellular phones, as an elastic wave resonator, a filter, a duplexer, a multiplexer applicable to a multiband system, a front end circuit, and a communication device, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
a piezoelectric substrate including a principal surface;
a first interdigital transducer (IDT) electrode provided over the principal surface of the piezoelectric substrate;
a first dielectric layer provided over the principal surface of the piezoelectric substrate;
a second IDT electrode provided over the first dielectric layer;
a second dielectric layer extending to an upper portion of the second IDT electrode from an upper portion of the first IDT electrode and filling a region between the first IDT electrode and the second IDT electrode, and including a first side surface connected to the first IDT electrode, and a second side surface connected to the second IDT electrode; and
a wiring electrode that passes over the second dielectric layer and extends to the upper portion of the second IDT electrode from the upper portion of the first IDT electrode; wherein
respective angles between the first and second side surfaces of the second dielectric layer and the principal surface of the piezoelectric substrate are smaller than an angle between a side surface at an end portion of the first dielectric layer toward the first IDT electrode and the principal surface of the piezoelectric substrate.

2. The elastic wave device according to claim 1, wherein a first elevation portion is provided on an upper surface of the second dielectric layer above the end portion of the first dielectric layer toward the first IDT electrode.

3. The elastic wave device according to claim 2, wherein an angle between an inclined surface defining the first elevation portion on the upper surface of the second dielectric layer and the principal surface of the piezoelectric substrate is smaller than an angle between the side surface of the first dielectric layer at the end portion toward the first IDT electrode and the principal surface of the piezoelectric substrate.

4. The elastic wave device according to claim 3, wherein
a second elevation portion is provided on the principal surface of the piezoelectric substrate;
a height of the principal surface on a side of the piezoelectric substrate on which the first IDT electrode is provided is different from a height of the principal surface on a side of the piezoelectric substrate on which the second IDT electrode is provided; and
a size of the first elevation portion on the upper surface of the second dielectric layer is smaller than a total of a size of the second elevation portion on the piezoelectric substrate and a thickness of the first dielectric layer.

5. The elastic wave device according to claim 3, wherein the wiring electrode passes over the first elevation portion on the upper surface of the second dielectric layer.

6. The elastic wave device according to claim 1, wherein the upper surface of the second dielectric layer is flat.

7. The elastic wave device according to claim 4, wherein the first IDT electrode and the second IDT electrode are separated with the second elevation portion of the piezoelectric substrate interposed therebetween.

8. The elastic wave device according to claim 1, wherein the second dielectric layer is provided over the first IDT electrode and the second IDT electrode.

9. The elastic wave device according to claim 8, wherein an elevation portion is provided on the principal surface of the piezoelectric substrate, a height of the principal surface on a side of the piezoelectric substrate on which the first IDT electrode is provided is different from a height of the principal surface on a side of the piezoelectric substrate on which the second IDT electrode is provided.

10. The elastic wave device according to claim 9, wherein
the elevation portion of the piezoelectric substrate includes an end surface at an angle with respect to the principal surface; and
the angle between the end surface and the principal surface is smaller than the angle between the side surface of the first dielectric layer at the end portion toward the first IDT electrode and the principal surface of the piezoelectric substrate.

11. A high-frequency front end circuit comprising:
the elastic wave device according to claim 1; and
a power amplifier.

12. The high-frequency front end circuit according to claim 11, wherein a first elevation portion is provided on an upper surface of the second dielectric layer above the end portion of the first dielectric layer toward the first IDT electrode.

13. The high-frequency front end circuit according to claim 12, wherein an angle between an inclined surface defining the first elevation portion on the upper surface of the second dielectric layer and the principal surface of the piezoelectric substrate is smaller than an angle between the side surface of the first dielectric layer at the end portion toward the first IDT electrode and the principal surface of the piezoelectric substrate.

14. The high-frequency front end circuit according to claim 13, wherein
- a second elevation portion is provided on the principal surface of the piezoelectric substrate;
- a height of the principal surface on a side of the piezoelectric substrate on which the first IDT electrode is provided is different from a height of the principal surface on a side of the piezoelectric substrate on which the second IDT electrode is provided; and
- a size of the first elevation portion on the upper surface of the second dielectric layer is smaller than a total of a size of the second elevation portion on the piezoelectric substrate and a thickness of the first dielectric layer.

15. The high-frequency front end circuit according to claim 13, wherein the wiring electrode passes over the first elevation portion on the upper surface of the second dielectric layer.

16. The high-frequency front end circuit according to claim 11, wherein the upper surface of the second dielectric layer is flat.

17. The high-frequency front end circuit according to claim 14, wherein the first IDT electrode and the second IDT electrode are separated with the second elevation portion of the piezoelectric substrate interposed therebetween.

18. The high-frequency front end circuit according to claim 11, wherein the second dielectric layer is provided over the first IDT electrode and the second IDT electrode.

19. The high-frequency front end circuit according to claim 18, wherein an elevation portion is provided on the principal surface of the piezoelectric substrate, a height of the principal surface on a side of the piezoelectric substrate on which the first IDT electrode is provided is different from a height of the principal surface on a side of the piezoelectric substrate on which the second IDT electrode is provided.

20. A communication device comprising:
- the high-frequency front end circuit according to claim 11; and
- an RF signal processing circuit.

* * * * *